United States Patent
Li (10) Patent No.: US 10,510,778 B2
(45) Date of Patent: Dec. 17, 2019

(54) ARRAY SUBSTRATE, DISPLAY DEVICE AND WEARABLE DEVICE

(71) Applicant: BOE TECHNOLOGY GROUP CO., LTD., Beijing (CN)

(72) Inventor: Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 68 days.

(21) Appl. No.: 15/306,789

(22) PCT Filed: Feb. 15, 2016

(86) PCT No.: PCT/CN2016/073781
§ 371 (c)(1),
(2) Date: Oct. 26, 2016

(87) PCT Pub. No.: WO2017/049847
PCT Pub. Date: Mar. 30, 2017

(65) Prior Publication Data
US 2017/0271369 A1    Sep. 21, 2017

(30) Foreign Application Priority Data

Sep. 21, 2015   (CN) .......................... 2015 1 0604216

(51) Int. Cl.
*H01L 27/12*    (2006.01)
(52) U.S. Cl.
CPC ........ *H01L 27/124* (2013.01); *H01L 27/1218* (2013.01)

(58) Field of Classification Search
CPC ............... H01L 27/124; H01L 27/1218; H01L 27/1214–27/1296; H01L 27/3244–27/3279; H01L 2021/775
See application file for complete search history.

(56) References Cited

U.S. PATENT DOCUMENTS

| 2002/0021375 | A1 | 2/2002 | Nakajima et al. |
| 2010/0289994 | A1* | 11/2010 | Nonaka ............. G02F 1/133514 349/108 |
| 2015/0348490 | A1* | 12/2015 | Gu .......................... G02F 1/155 345/105 |

(Continued)

FOREIGN PATENT DOCUMENTS

| CN | 1495473 A | 5/2004 |
| CN | 101887189 A | 11/2010 |

(Continued)

OTHER PUBLICATIONS

First Office Action for Chinese Application No. 201510604216.3, dated Aug. 9, 2017, 7 Pages.

(Continued)

*Primary Examiner* — Selim U Ahmed
(74) *Attorney, Agent, or Firm* — Brooks Kushman P.C.

(57) ABSTRACT

The present disclosure provides an array substrate, a display device and a wearable device. The array substrate includes a plurality of pixel units. Each of the pixel units includes a pixel electrode and a thin film transistor connected to the pixel electrodes, the plurality of pixel units forms a display region, and the thin film transistor of the pixel unit at an edge of the display region is closer to the edge of the display region than the pixel electrode thereof.

9 Claims, 6 Drawing Sheets

(56) References Cited

U.S. PATENT DOCUMENTS

2016/0328071 A1  11/2016  Yan
2017/0148864 A1   5/2017  Wu

FOREIGN PATENT DOCUMENTS

| CN | 101995718 A  |  3/2011 |
|----|--------------|---------|
| CN | 104820321 A  |  8/2015 |
| CN | 104916252 A  |  9/2015 |
| CN | 105093761 A  | 11/2015 |
| CN | 204925572 U  | 12/2015 |
| CN | 105372894 A  |  3/2016 |
| JP | 2006276580 A | 10/2006 |
| JP | 2009271392 A | 11/2009 |

OTHER PUBLICATIONS

International Search Report and Written Opinion for Application No. PCT/CN2016/073781, dated Jun. 14, 2016, 10 Pages.

\* cited by examiner

ARRAY SUBSTRATE, DISPLAY DEVICE AND WEARABLE DEVICE

CROSS-REFERENCE TO RELATED APPLICATIONS

This application is the U.S. national phase of PCT Application No. PCT/CN2016/073781 filed on Feb. 15, 2016, which claims priority to Chinese Patent Application No. 201510604216.3 filed on Sep. 21, 2015, the disclosures of which are incorporated in their entirety by reference herein.

TECHNICAL FIELD

The present disclosure relates to the field of display technology, and in particular to an array substrate, a display device and a wearable device.

BACKGROUND

With the development of display technology, liquid crystal display technology has been widely applied in a variety of display devices. At present, in addition to conventional TV, computer, IPAD, the liquid crystal display has been applied to the wearable devices.

Figure 1:
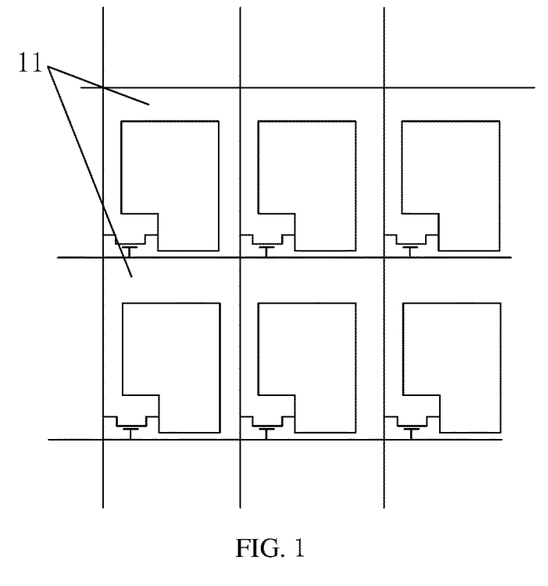
FIG. 1 is a schematic view of an arrangement of pixel units of an array substrate in the related art.
Figure 2:
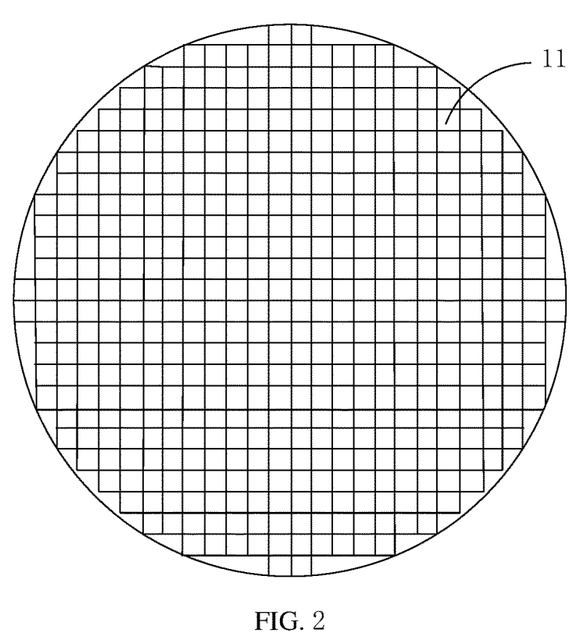
FIG. 2 is a schematic view of an arrangement of pixel units when a display region is circular in the related art.

Due to the requirement of wearable devices of various structures, dials of wearable devices on the market today vary widely in shape, which are circular or other irregular shapes in addition to conventional rectangular designs. However, for a circular or other irregularly shaped display dial, when pixel units of an array substrate are arranged in a way in the related art shown in FIG. 1, since a region of the pixel unit 11 is generally a regular rectangular region, and when a plurality of pixel units are arranged on an array substrate to form a circular or other irregularly shaped display region, as shown in FIG. 2, since the edges are not exhibit horizontal or vertical, resulting in a zigzag pattern in the design of edge regions, the aperture ratio and utilization ratio of edge pixel units are low, thereby affecting the display quality thereof.

SUMMARY

The object of the technical solution of the present disclosure is to provide an array substrate, a display device and a wearable device, which solves the problem that the edge display quality of the circular or irregularly shaped display region in the prior art is low.

An array substrate is provided by the present disclosure, including a plurality of pixel units. Each of the pixel units includes a pixel electrode and a thin film transistor connected to the pixel electrode, the plurality of pixel units forms a display region, and the thin film transistor of the pixel unit at an edge of the display region is closer to the edge of the display region than the pixel electrode thereof.

Optionally, the array substrate includes at least two arrangement regions, each arrangement region corresponding to one of edge ranges of the display region, respectively. Each arrangement region corresponds to a peripheral portion of the display region, orientations of the thin film transistors of the pixel units relative to the corresponding pixel electrodes thereof are the same at any one of the at least two arrangement regions, and the orientations of the thin film transistors of the pixel units relative to the corresponding pixel electrodes thereof at any one of the at least two arrangement regions are different from that at the rest of the arrangement regions.

Optionally, the array substrate includes four arrangement regions. A first arrangement region corresponds to an upper left peripheral portion of the display region, and the thin film transistor of each pixel unit in the first arrangement region is on the upper left of the pixel electrode thereof. A second arrangement region corresponds to an upper right peripheral portion of the display region, and the thin film transistor of each pixel unit is on the upper right of the pixel electrode thereof. A third arrangement region corresponds to a lower left peripheral portion of the display region, and the thin film transistor of each pixel unit is on the lower left of the pixel electrode thereof. A fourth arrangement region corresponds to a lower right peripheral portion of the display region, and the thin film transistor of each pixel unit is on the lower right of the pixel electrode thereof.

Optionally, the arrangement regions form the peripheral portion of the display region.

Optionally, the arrangement regions form the display region.

Optionally, the array substrate includes a plurality of edge pixel units at the edge of the display region. A pixel electrode of each edge pixel unit includes a first edge forming a part of the edge of the display region and the first edge being curved, and a thin film transistor of each edge pixel unit is closer to the edge of the display region than the pixel electrode thereof.

Optionally, the first edges of the pixel electrodes of the edge pixel units form the edge of the display region.

Optionally, the edge of the display region includes at least one arc segment.

Optionally, the display region is circular or elliptical.

Optionally, the thin film transistor of each pixel unit at the edge of the display region is farther away from a center of the display region than the pixel electrode thereof.

Optionally, the array substrate further includes a fifth arrangement region enclosed by the arrangement regions corresponding to the peripheral portions of the display region. Orientations of the thin film transistors of the pixel units relative to the corresponding pixel electrodes thereof are the same at the fifth arrangement region.

Optionally, the thin film transistor of each edge pixel unit is farther away from a center of the display region than the pixel electrode thereof.

Optionally, the edge pixel units and the rest of the pixel units in the display region are controlled via different control lines.

A display device is further provided by the present disclosure, including the array substrate hereinabove.

A wearable device is further provided by the present disclosure, including the display device hereinabove.

At least one of the above-mentioned technical solutions of specific embodiments of the present disclosure has the following advantageous effects:

According to the array substrate hereinabove, the thin film transistors of the pixel units at the edge of the display region of the array substrate are close to the edge of the display region, then the thin film transistors occupy the space at the edge of the display region, so as to reserve more space to arrange the pixel electrodes for the image display, thereby improving the aperture ratio and the utilization ratio of the pixel units at the edge of the display panel and improving the display quality in compared with the related art.

DETAILED DESCRIPTION

In order to make the technical issues, the technical solutions and the advantages of the present disclosure more apparent, the present disclosure will be described hereinafter in a clear manner in conjunction with the drawings and embodiments.

An array substrate is provided in some embodiments of the present disclosure, including a plurality of pixel units. Each of the pixel units includes a pixel electrode and a thin film transistor connected to the pixel electrode, the plurality of pixel units forms a display region, and the thin film transistor of the pixel unit at an edge of the display region is closer to the edge of the display region than the pixel electrode thereof.

According to the array substrate hereinabove, the thin film transistors of the pixel units at the edge of the display region of the array substrate are close to the edge of the display region, then the thin film transistors occupy the space at the edge of the display region, so as to reserve more space to arrange the pixel electrodes for the image display, thereby improving the aperture ratio and the utilization ratio of the pixel units at the edge of the display panel and improving the display quality in compared with the related art.

According to the array substrate in some embodiments of the present invention, an orientation of the thin film transistor of each pixel unit relative to the pixel electrode thereof may be arranged based on a shape of the edge of the display region, or an orientation of the thin film transistor of each pixel unit relative to the pixel electrode thereof in each partial region may be arranged based on the overall shape of the display region, so as to make the thin film transistor of each pixel unit at the edge of the display region closer to the edge of the display region than the pixel electrode thereof.

In the present disclosure, an edge of the display region refers to an edge of an entire region composed of the pixel units.

Specifically, the array substrate includes at least two arrangement regions. Each arrangement region corresponds to a peripheral portion of the display region. Orientations of the thin film transistors of the pixel units relative to the corresponding pixel electrodes thereof are the same at any one of the at least two arrangement regions, and the orientations of the thin film transistors of the pixel units relative to the corresponding pixel electrodes thereof at any one of the at least two arrangement regions are different from that at the rest of the arrangement regions.

According to the arrangement hereinabove, in the entire display region of the array substrate in some embodiments of the present disclosure, the orientations of the thin film transistors relative to the corresponding pixel electrodes may be different. Depending on the different orientations, the entire display region of the array substrate is divided into a plurality of arrangement regions. By such arrangement, the array substrate in some embodiments of the present disclosure may be applied to a display panel with a circle, elliptical display region or an irregular-shaped display region of which at least one section of the edge is curved. Based on the shape of the display region, the thin film transistor of each pixel unit in different region is arranged closed to the edge of the display region, so as to leave more space to arrange the pixel electrodes for the image display, thereby improving the aperture ratio and the utilization ratio of the pixel units at the edge of the display panel and improving the display quality in compared with the related art.

Hereinafter, the specific structure of the array substrate of the present disclosure will be described in detail.

Figure 3:
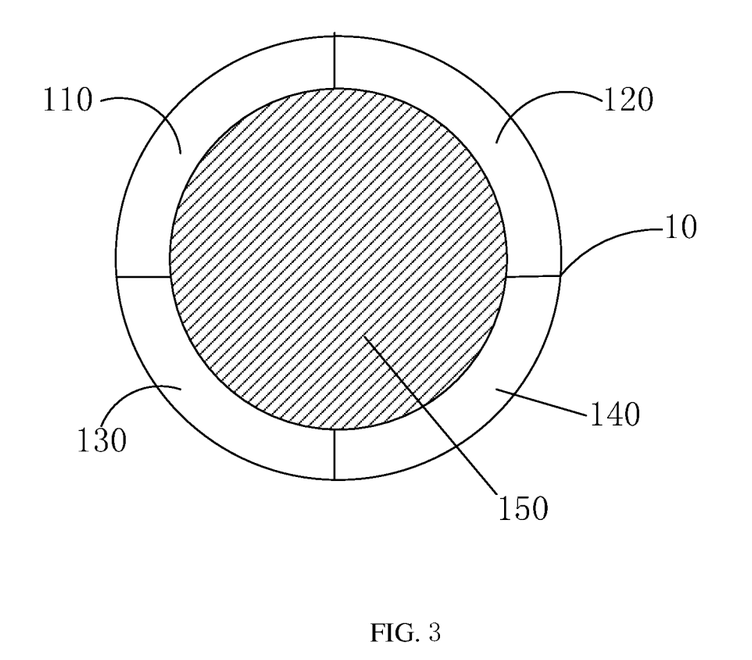
FIG. 3 is a schematic view of arrangement regions determined based on different arrangement orientations of thin film transistors of an array substrate in some embodiments of the present disclosure.

FIG. 3 is a schematic view of an array substrate in some embodiments of the present disclosure. Referring to FIG. 3, the array substrate 10 includes a plurality of pixel units, and the plurality of pixel units forms a display region. In some embodiments of the present disclosure, the display region is circular, i.e., a plurality of pixel units are arranged to form a circular display region. Those skilled in the art may appreciate that, each pixel unit includes a thin film transistor and a pixel electrode connected to the thin film transistor. As shown in FIG. 1, the thin film transistors are connected to data lines and gate lines which are crossed on the array substrate, and the structure of arrangement of the pixel units is in compliance with the related art, and the detail description thereof is omitted herein.

Referring to FIG. 3, the array substrate 10 includes at least four arrangement regions, i.e., a first arrangement region 110 corresponds to an upper left peripheral portion of the display region, a second arrangement region 120 corresponds to an upper right peripheral portion of the display region, a third arrangement region 130 corresponds to a lower left peripheral portion of the display region, and a fourth arrangement region 140 corresponds to a lower right peripheral portion of the display region.

Figure 4A:
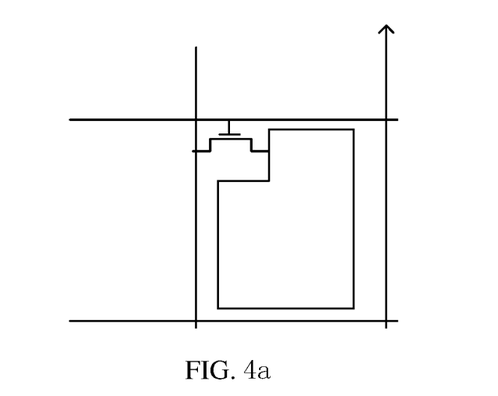
FIGS. 4a to 4d are schematic views of the pixel units arranged in four arrangement regions.
Figure 4B:
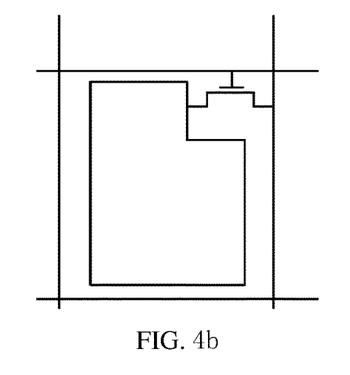
Figure 4C:
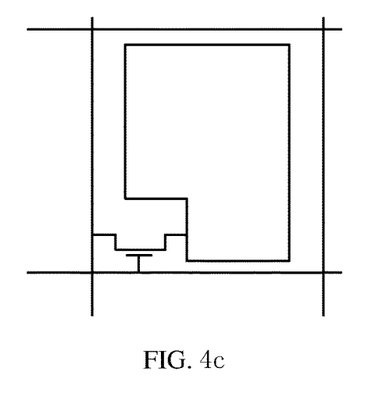
Figure 4D:
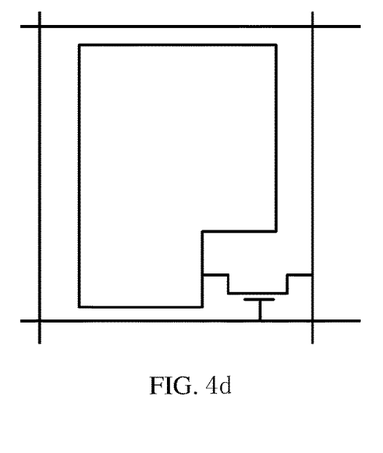

As shown in FIG. 4a, in the first arrangement region 110, the thin film transistor of each pixel unit in the first arrangement region is on the upper left of the pixel electrode thereof. As shown in FIG. 4b, in the second arrangement region 120, the thin film transistor of each pixel unit is on the upper right of the pixel electrode thereof. As shown in FIG. 4c, in the third arrangement region 130, the thin film transistor of each pixel unit is on the upper right of the pixel electrode thereof. As shown in FIG. 4d, in the fourth arrangement region 140, the thin film transistor of each pixel unit is on the lower right of the pixel electrode thereof.

Based on the above arrangement, the array substrate 10 further includes a fifth arrangement region 150 surrounded by the first arrangement region 110, the second arrangement region 120, the third arrangement region 130, and the fourth arrangement region 140. In the fifth arrangement region 150, the orientation of each thin film transistor relative to the corresponding pixel electrode may not affect the display effect at the edge of the display region, so the orientation of the each thin film transistor is not limited. Optionally, the thin film transistors are arranged as in one of the first arrangement region 110, the second arrangement region 120, the third arrangement region 130 and the fourth arrangement region 140. For example, in some embodiments of the present disclosure, the orientation of each thin film transistor relative to the corresponding pixel electrode in the fifth arrangement region 150 may be arranged in any of the ways shown in FIGS. 4a to 4d.

Figure 5A:
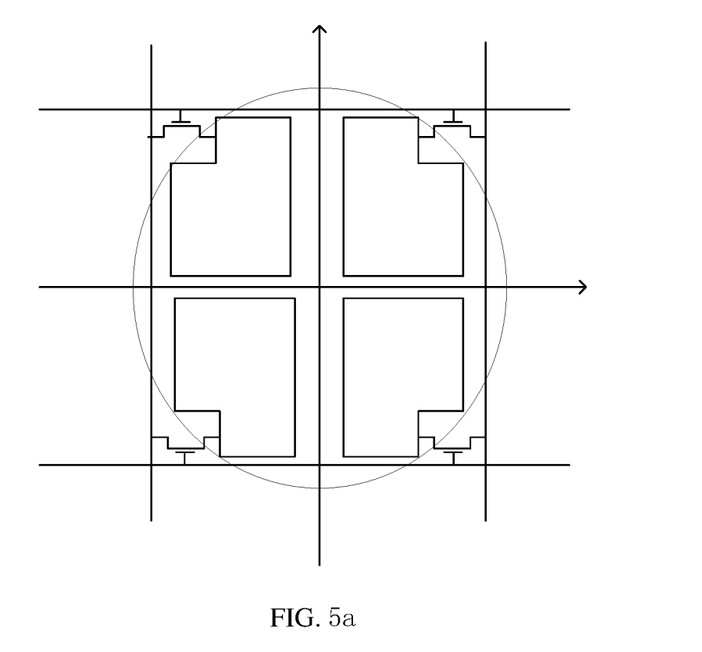
FIGS. 5a and 5b are schematic views of the display region in some embodiments of the present disclosure and that in the related art respectively.
Figure 5B:
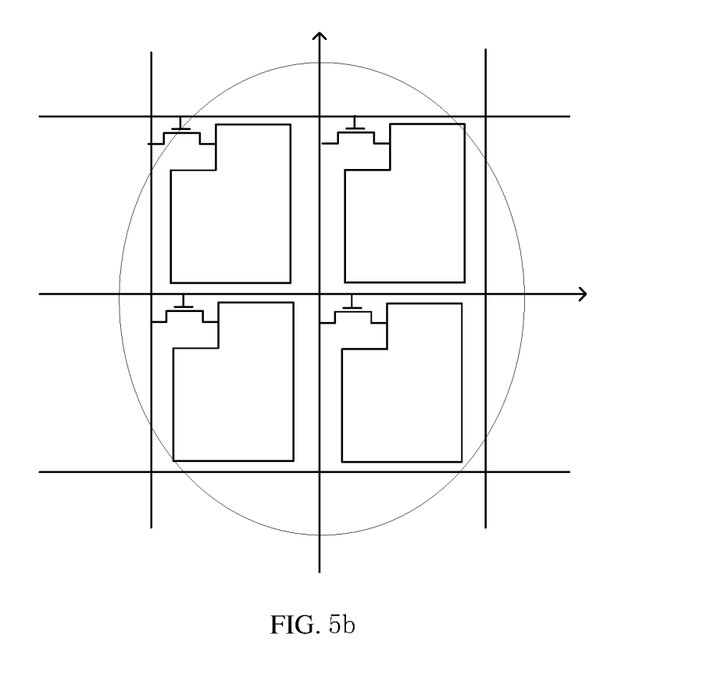

With the arrangement hereinabove, taking an example that the circular display region is formed by four pixel units, as shown in FIG. 5a, when the display region is circular, the thin film transistors are arranged in different orientations relative to the pixel electrodes at different positions, and then the aperture ratio and utilization ratio of the pixel units at the edge of the display region are significantly improved in compared with the solution in the related art shown in FIG. 5b, namely the orientations of the thin film transistors of the pixel units relative to the corresponding pixel electrodes thereof are the same in the whole display region, thereby improving display quality at the edge of the display region.

According to the arrangement hereinabove, the orientation of the thin film transistor in each pixel unit of the array substrate may be determined based on the shape of the edge of the display region, and the thin film transistor is closer to the edge of the display region than the corresponding pixel electrode. When the display region is circular or elliptical, it is preferable that the array substrate includes at least four arrangement regions, as shown in FIG. 3, based on the orientations of the pixel electrodes. The first arrangement region 110, the second arrangement region 120, the third arrangement region 130, and the fourth arrangement region 140 are combined to form the peripheral portion of the display region. Specifically, the widths of the first arrangement region 110, the second arrangement region 120, the third arrangement region 130, and the fourth arrangement regions 140 toward the center of the display region may be determined according to the design requirements of the display panel.

An array substrate is further provided in some embodiments of the present disclosure. The first arrangement region 110, the second arrangement region 120, the third arrangement region 130 and the fourth arrangement region 140 of the array substrate 10 form the entire display region, as shown in FIG. 6.

Figure 6:
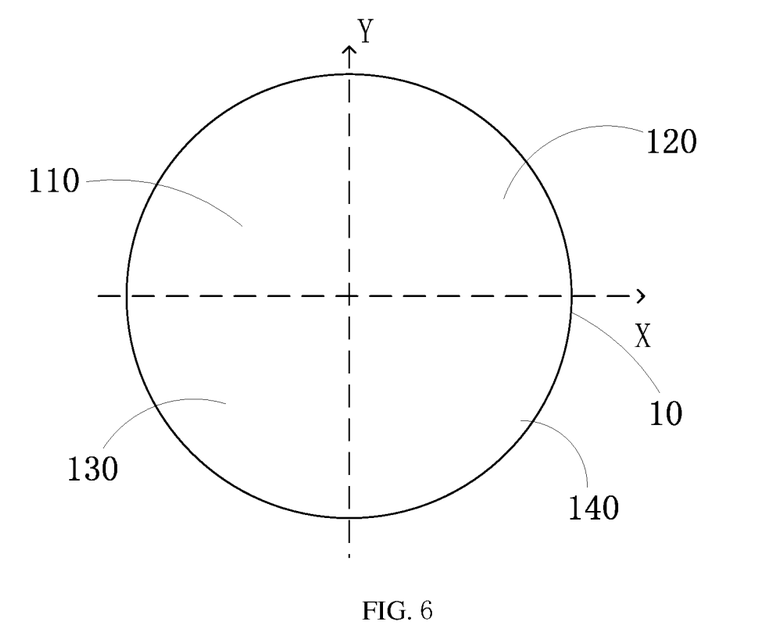
FIG. 6 is a schematic view of arrangement regions determined based on different arrangement orientations of thin film transistors of an array substrate in some embodiments of the present disclosure.

Referring to FIG. 6, in some embodiments of the present disclosure, the display region is also circular. In the entire display region, taking the X-axis and Y-axis lines of the display region as dividing lines, the entire display region is divided into four display quadrant regions, namely four arrangement regions.

As shown in FIG. 4a, in the first arrangement region 110, the thin film transistor of each pixel unit in the first arrangement region is on the upper left of the pixel electrode thereof. As shown in FIG. 4b, in the second arrangement region 120, the thin film transistor of each pixel unit is on the upper right of the pixel electrode thereof. As shown in FIG. 4c, in the third arrangement region 130, the thin film transistor of each pixel unit is on the upper right of the pixel electrode thereof. As shown in FIG. 4d, in the fourth arrangement region 140, the thin film transistor of each pixel unit is on the lower right of the pixel electrode thereof.

With the arrangement regions hereinabove, the pixel electrodes at the edge of each arrangement region are located at the side closer to the edge of the display region. Referring to FIGS. 5a and 5b, in compared with the prior art, the aperture ratio and the utilization rate at the edge of the pixel region may be improved and the display quality is improved.

In some embodiments of the present disclosure, the display region is divided into four arrangement regions according to two coordinate directions, thereby making the layout of the lines on the array substrate simpler and easier to be implemented.

Figure 7:
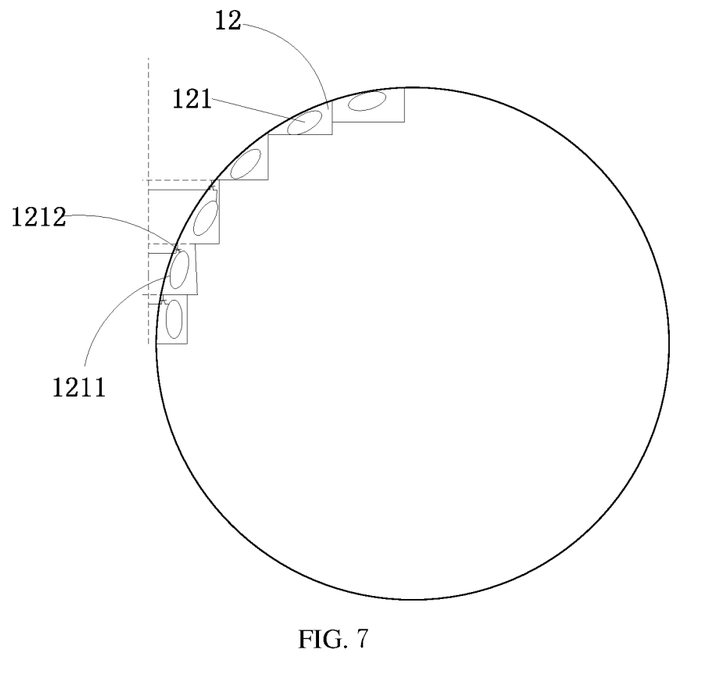
FIG. 7 is a schematic view of an array substrate in some embodiments of the present disclosure.

An array substrate is further provided in some embodiments of the present disclosure, as shown in FIG. 7, and the array substrate includes a plurality of edge pixel units 12 at the edge of the display region, and a pixel electrode 121 of each edge pixel unit 12 includes a first edge 1211 forming a part of the edge of the display region and the first edge 1211 being curved, and a thin film transistor 1212 of each edge pixel unit 12 is closer to the edge of the display region than the pixel electrode 121 thereof. Optionally, the first edges of the pixel electrodes 121 of the edge pixel units 12 are combined to form the edge of the display region.

In the array substrate in some embodiments of the present disclosure, on the basis that the pixel electrodes of the edge pixel units 12 at the edge of the display region are arranged on the side closer to the edge of the display region, the edges (the first edges 1211) of the pixel electrodes of the edge pixel units 12, which are close to the edge of the display region, may further be arranged based on the shape of the corresponding section of the edge of the display region, that is, the shape of each pixel electrode corresponds to the shape of edge of the display region. Therefore, the space occupied by the thin film transistors at the edge of the display region is further reduced, thereby improving the aperture ratio and the utilization factor of the pixel units significantly.

Figure 8:
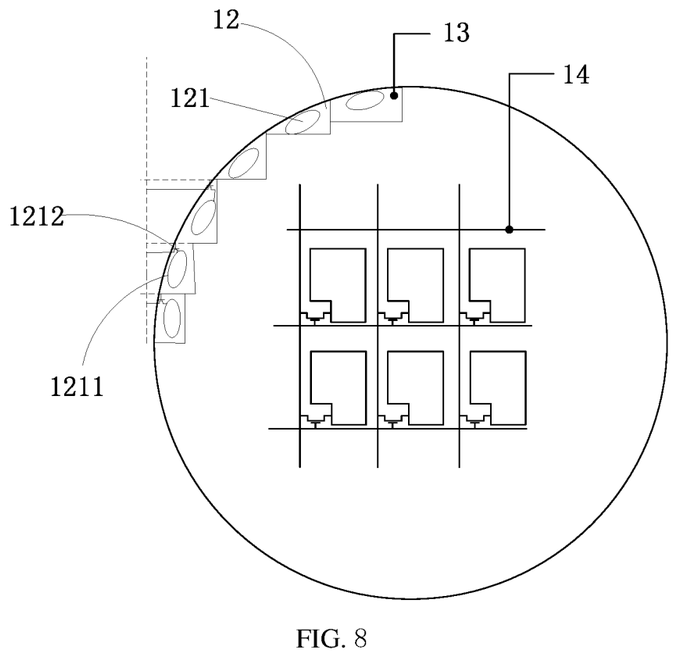
FIG. 8 is a schematic view of an array substrate in some embodiments of the present disclosure.

Of course, in the array substrate in some embodiments of the present disclosure, the pixel units in other regions of the display region excepting the edge pixel units 12 may be arranged as in the related art. Optionally, the edge pixel units 12 and the rest of the pixel units in the display region are controlled via different control lines. For example, in some embodiments of the present disclosure, the input control circuit 13 of the edge pixel unit 12 and the input control circuit 14 of the pixel unit in other regions may be arranged as shown in FIG. 8.

A display device including the array substrate hereinabove is further provided in some embodiments of the present disclosure, and the specific structure of the array substrate arranged in the display device may refer to the description of the above embodiments, and the detailed description thereof is omitted herein.

A wearable device is further provided in some embodiments of the present disclosure, comprising the display device hereinabove.

According to the display device and the wearable device, the display region of the array substrate having the structure hereinabove may be circular, elliptical or other irregularly shape, thereby diversifying the structure of the display device and improving the display quality at the edge of the display region in compared with the related art.

The foregoing is a preferred embodiment of the present disclosure. It should be noted that those of ordinary skill in the art may further make a number of improvements and modifications without departing from the principles of the present disclosure, which improvements and modifications should also be deemed to be within the scope of the present disclosure.

What is claimed is:

1. An array substrate, comprising a plurality of pixel units, wherein each of the pixel units comprises a pixel electrode and a thin film transistor connected to the pixel electrode, the plurality of pixel units forms a display region, and the thin film transistor of each of the pixel units at an edge of the display region is closer to the edge of the display region than the pixel electrode thereof;

the array substrate comprises a first arrangement region, a second arrangement region, a third arrangement region and a fourth arrangement region which together form the edge of the display region, wherein the first arrangement region corresponds to an upper left peripheral portion of the display region, the thin film transistor of each pixel unit in the first arrangement region is on the upper left of the pixel electrode thereof;

the second arrangement region corresponds to an upper right peripheral portion of the display region, the thin film transistor of each pixel unit in the second arrangement region is on the upper right of the pixel electrode thereof;

the third arrangement region corresponds to a lower left peripheral portion of the display region, the thin film transistor of each pixel unit in the third arrangement region is on the lower left of the pixel electrode thereof; and the fourth arrangement region corresponds to a lower right peripheral portion of the display region, the thin film transistor of each pixel unit in the fourth arrangement region is on the lower right of the pixel electrode thereof;

wherein the array substrate further comprises a plurality of edge pixel units at the upper left peripheral portion, the upper right peripheral portion, the lower left peripheral portion and the lower right peripheral portion of the display region, and a thin film transistor of each edge pixel unit at the upper left peripheral portion, the upper right peripheral portion, the lower left peripheral portion and the lower right peripheral portion of the display region is farther away from a center of the display region than the pixel electrode thereof.

2. The array substrate according to claim 1, wherein a pixel electrode of each edge pixel unit comprises a first edge forming a part of the edge of the display region and the first edge being curved, and a thin film transistor of each edge pixel unit is closer to the edge of the display region than the pixel electrode thereof.

3. The array substrate according to claim 2, wherein the first edges of the pixel electrodes of the edge pixel units form the edge of the display region.

4. The array substrate according to claim 1, wherein the edge of the display region comprises at least one arc segment.

5. The array substrate according to claim 4, where the display region is circular or elliptical.

6. The array substrate according to claim 1, further comprising a fifth arrangement region enclosed by the arrangement regions corresponding to the peripheral portions of the display region, wherein orientations of the thin film transistors of the pixel units relative to the corresponding pixel electrodes thereof are the same at the fifth arrangement region.

7. The array substrate according to claim 2, wherein the edge pixel units and the rest of the pixel units in the display region are controlled via different control lines.

8. The array substrate according to claim 1, wherein the arrangement regions form the peripheral portion of the display region.

9. The array substrate according to claim 1, wherein the arrangement regions form the display region.

* * * * *